US006455940B2

(12) United States Patent
Satou

(10) Patent No.: US 6,455,940 B2
(45) Date of Patent: *Sep. 24, 2002

(54) SEMICONDUCTOR DEVICE INCLUDING LEAD WIRING PROTECTED BY DUAL BARRIER FILMS

(75) Inventor: Tamio Satou, Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 23 days.

(21) Appl. No.: 09/060,344

(22) Filed: Apr. 15, 1998

(30) Foreign Application Priority Data

Aug. 28, 1997  (JP) ............................................... 9-232094

(51) Int. Cl.[7] ................................................ H01L 23/48
(52) U.S. Cl. ........................ 257/774; 257/751; 257/762; 257/763
(58) Field of Search ................................ 257/751, 752, 257/762, 767, 763, 765, 771, 773, 774, 776, 754; 438/618, 622, 623, 627, 629, 643, 653, 666, 687

(56) References Cited

U.S. PATENT DOCUMENTS

| 4,843,453 A | * | 6/1989 | Hooper et al. ............... 257/751 |
| 4,970,574 A | * | 11/1990 | Tsunenari .................... 257/763 |
| 5,686,760 A | * | 11/1997 | Miyakawa ................... 257/751 |
| 5,798,559 A | * | 8/1998 | Bothra et al. ................ 257/522 |
| 5,891,513 A | * | 4/1999 | Dubin et al. .................. 427/98 |
| 5,990,507 A | * | 11/1999 | Mochizuki et al. ......... 257/295 |

FOREIGN PATENT DOCUMENTS

| JP | 61-156872 | * | 7/1986 |
| JP | 7201851 |   | 8/1995 |

OTHER PUBLICATIONS

IBM Technical Disclosure Bulletin, vol. 28, No. 4, Sep. 1985, pp. 1417–1418, Ohmic Contacts To Semiconductor Devices Using Barrier Layers Of Aluminum And Titanium, Sep. 1985.*

Semicon NEWS 1998.7, A special Supplement to Materials for Semiconductor of Next Generation: Polyimide Resin, pp. 59–64.

Hitachikasei Technical Report No. 27 (1996–7), "i–Line Stepper Definable Photosensitive Polyimide PL–3708", pp. 15–18.

* cited by examiner

*Primary Examiner*—Steven Loke
*Assistant Examiner*—Hung Kim Vu
(74) *Attorney, Agent, or Firm*—Leydig, Voit & Mayer, Ltd.

(57) ABSTRACT

A semiconductor device includes a semiconductor element provided on a substrate, a lead-in wiring electrically provided on a substrate, a lead-in wiring electrically connected with the electrode of the semiconductor element, a barrier metal film for covering the lead-in wiring surface for protecting the lead-in wire, wherein the section of the lead-in wiring is inversely trapezoidal in shape vertial to the lengthwise direction of the lead-in wiring.

11 Claims, 9 Drawing Sheets

SEMICONDUCTOR DEVICE INCLUDING LEAD WIRING PROTECTED BY DUAL BARRIER FILMS

BACKGROUND OF THE INVENTION

The present invention relates to a semiconductor device such as CSP (Chip Scale Package) including copper (Cu) wiring coated with barrier metal film for preventing oxidation and corrosion during a processing operation, and a method of producing the semiconductor device and a method of producing the semiconductor device. More particularly, the present invention relates to a semiconductor device which can improve the step coverage of the barrier metal film with respect to the Cu wiring or the like, and a method of producing the semiconductor device.

One example of the CSP includes a semiconductor element formed on a substrate, and a lead-in wiring for electrically connecting between an outputting electrode of the semiconductor element and the external electrode. The semiconductor element includes a plurality of electrodes. A plurality of lead-in wiring connected respectively with each electrode are provided without being in contact with each other electrically. In order to provide the semiconductor element with a function of relaxing that the stress to be applied upon the external electrode is applied to the semiconductor element, the semiconductor element further includes at least one interlayer film (referred to as insulation interlayer film). The surface of the semiconductor element is covered with protective films.

As the lead-in wiring, Cu wiring is used because electrical characteristics thereof are superior. The Cu wiring is necessary to be covered with barrier metal films, because oxidation and corrosion are caused during all of the producing steps.

FIG. 9 is a sectional view for explaining the Cu wiring to be included in the conventional semiconductor device. In FIG. 9, reference numeral 1 denotes a first barrier metal film, reference numeral 2 Cu wiring, reference numeral 3 a second barrier metal film, reference numeral 5 an interlayer film, respectively. The interlayer film 5 is formed on a substrate (not shown), so as to provide functions of insulation between the lead-in wirings, stress relaxation and alpha ray shielding of the semiconductor element. The silicon oxide which is a material of the insulation interlayer film to be included in the semiconductor element is preferably used as the interlayer film 5 because the interlayer film has proper insulation as the material of the interlayer film 5 in terms of the insulation between each lead-in wirings. In order to relax the stress, polyimide resin is preferably used as the material of the interlayer film 5.

A method of producing the Cu wiring of the conventional semiconductor device will be described with reference to FIG. 9. The Cu wiring is formed after the semiconductor element (not shown) has been formed. On a substrate where the interlayer film 5 has been formed on the surface thereof is filmed a titanium film serving as a first barrier metal film 1. The Cu film serving as Cu wiring 2 is filmed to form a predetermined shape of Cu wiring 2 by a photo-lithography art. The photo-lithography art includes a step of forming an etching mask by using, for example, photo-resist or the like on the predetermined region of the film surfaces to be etched later, and a step of conducting the etching operation, such as dry etching or wet etching. Finally, a titanium (or titanium nitride) film serving as a second barrier metal film 3 is filmed. First barrier metal film 1 and second barrier metal film 3 of a predetermined shape are formed by the photo-lithography art. The second barrier metal film 3 covers the top face and side face of the surface of the Cu wiring 2. By the above described conventional producing method, Cu wiring covered with barrier metal films composed of the first barrier metal film and the second barrier metal film can be formed.

When the Cu wiring has been formed by the conventional process (producing method), there arises a problem of a step coverage of the barrier metal film with respect to the side wall portion (side face) of the Cu wiring. Namely, the second barrier film becomes uneven in thickness, because the side face of the Cu wiring is vertical to the top face of the Cu wiring.

An object of the present invention is to provide a semiconductor device which can improve the step coverage of the barrier metal film with respect to lead-in wiring such as Cu wiring or the like, and a method of producing the semiconductor device.

SUMMARY OF THE INVENTION

A semiconductor device according to claim 1 of the present invention comprises a semiconductor element provided on a substrate, a lead-in wiring electrically connected with an electrode of the semiconductor element, a barrier metal film for covering the lead-in wiring surface to protect the lead-in wire. The section of the lead-in wiring, which is vertical to the lengthwise direction of the lead-in wiring, is inversely trapezoidal in shape.

Furthermore, in a semiconductor device according to claim 2, the barrier metal film comprises a first barrier metal film for covering a bottom face and a side face of the lead-in wiring, and a second barrier metal film for covering a top face of the lead-in wiring.

In a semiconductor device according to claim 3, a material of the first barrier metal film and a second barrier metal film is one of titan, titan nitride and tungsten.

A method of producing a semiconductor device according to claim 4 of the present invention comprises steps of: (i) providing a semiconductor element on a substrate; and (ii) providing on the substrate a lead-in wiring electrically connected with an electrode of the semiconductor element and having a surface covered with a first barrier metal film and a second barrier metal film. The second step comprises steps of forming a casting film having an inversely trapezoidal groove, composed of a material of an insulating interlayer film included in the semiconductor element or a material for protective film for covering the surfaces of the semiconductor element; providing a first barrier metal film on the groove surface of the casting film; providing the lead-in wiring within the groove of the casting film through the first barrier metal film; and providing a second barrier metal film on the top face of the lead-in wiring. The section of the lead-in wiring, which is vertical with respect to the lengthwise direction of the lead-in wiring, is inversely trapezoidal in shape.

In a method of producing a semiconductor device according to claim 5, a material of the insulating interlayer film included in the semiconductor element is one of silicon oxide, silicon nitride, polyimide resin and epoxy resin.

In a method of producing a semiconductor device according to claim 6, a material of the insulating interlayer film included in the semiconductor element is polyimide resin.

In a method of producing a semiconductor device according to claim 7, a material for the protective film for covering the surface of the semiconductor element is one of polyimide resin, silicon oxide, silicon nitride, and epoxy resin.

In a method of producing a semiconductor device according to claim 8, a material for the protective film for covering the surface of the semiconductor element is silicon nitride.

A method of producing a semiconductor device according to claim 9 the present invention comprises: a first step of providing a semiconductor element on a substrate; and a second step of providing on the substrate a lead-in wiring electrically connected with an electrode of the semiconductor element and having a surface covered with a first barrier metal film and a second barrier metal film. The second step comprises steps of: providing a first barrier metal film on the substrate; providing a metal film, one portion of which include the lead-in wiring later, on the first barrier metal film; providing a first etching mask in a region which becomes the lead-in wiring of the metal film, and providing a second etching mask of which adhesion force with respect to the metal film is weaker than that between the first etching mask and the metal film, in a region serving as the surrounding portion of the lead-in wiring of the metal film; forming the lead-in wiring by etching the metal film; removing the first etching mask and the second etching mask; and forming a second barrier metal film on the surface where the lead-in wiring has been exposed. The section of the lead-in wiring, which is vertical with respect to the lengthwise direction of the lead-in wiring, is trapezoidal in shape.

In a method of producing a semiconductor device according to claim 10, a material for the first etching mask is different from a material for the second etching mask.

A method of producing a semiconductor device according to claim 11 uses a chemical treatment to weaken the adhesion force between the second etching mask and the metal film lower than that between the first etching mask and the metal film.

A method of producing a semiconductor device according to claim 12 is the chemical treatment for removing at least the second etching mask from the metal film.

In a method of producing a semiconductor device according to claim 13, the optical radiation in providing the first etching mask is different from that in providing the second etching mask.

DETAILED DESCRIPTION OF THE INVENTION

Then, a semiconductor of the invention and a method of producing the semiconductor will be described.

Embodiment 1

Embodiment 1 of a semiconductor device and the semiconductor device producing method of this invention will be described with reference to the drawings.

Figure 1:
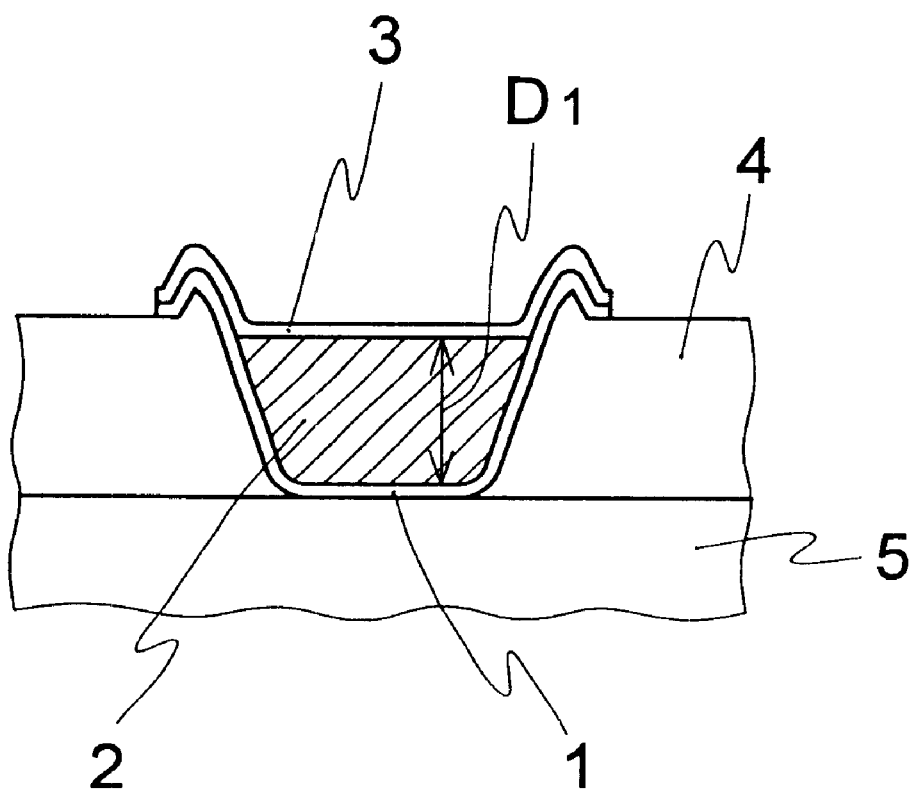
FIG. 1 is a sectional view for illustrating one embodiment of a semiconductor device of the present invention.

FIG. 1 is a sectional illustrating view showing one embodiment of the semiconductor device of this invention. FIG. 1 shows only the Cu wiring 2 and its surrounding portion of the semiconductor device, the vertical section with respect to the length direction of the Cu wiring 2. In FIG. 1, reference numeral 1 is a first barrier metal film, reference numeral 2 is Cu wiring, reference numeral 3 is a second barrier metal film, reference numeral 4 is a film for casting (a casting film) reference numeral 5 is an interlayer film. The Cu wiring 2 is one example of the lead-in wiring electrically connected between the electrode of the semiconductor element and the external electrode of the semiconductor device. The first barrier metal film 1 and the second barrier metal film 3 are provided to prevent the Cu wiring 2 from being oxidized and corroded during all of the producing steps. The casting film 4 is composed of a material of the insulating interlayer film included in the semiconductor element and a protective film for covering the semiconductor element surface, and has an inversely trapezoidal groove, having a reversibly trapezoidal groove. In Embodiment 1, polyimide resin is used as a material of the casting film 4, and a polyimide film serving as a casting film 4 later is formed on the interlayer film 5.

In Embodiment 1 is provided, as shown in FIG. 1, an inversely trapezoidal groove (in FIG. 1, there is shown a taper-shaped opening, width of which increases as depth $D_1$ decreases.). By providing the Cu wiring 2 along the shape of the groove of the casting film 4 is formed Cu wiring 2 where the section vertical to the lengthwise direction of the Cu wiring 2 is inversely trapezoidal.

Figure 2A:
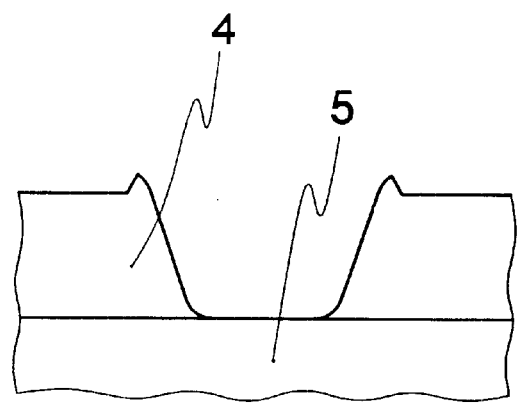
FIGS. 2(*a*) to 2(*c*) are sectional views for illustrating one embodiment of a method of producing a semiconductor device of the invention.
Figure 2B:
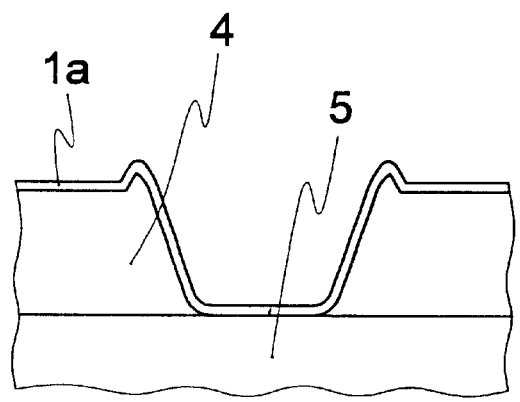
Figure 2C:
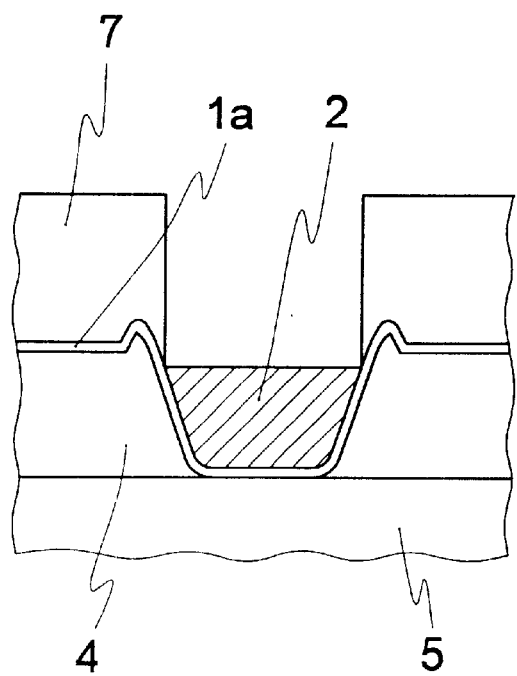

One embodiment of a method of producing a semiconductor device of this invention will be described. FIGS. 2(*a*) to 2(*c*) and FIGS. 3(*a*) and 3(*b*) indicate a sectional illustrating view showing one embodiment of a method of producing the semiconductor device of the invention. Referring to FIGS. 2(*a*) to 2(*c*) and FIGS. 3(*a*) and 3(*b*), the same reference numerals are used in the same portions as those of FIG. 1.

A polyimide film is formed on the interlayer film 5. A groove which is reversibly trapezoidal in the sectional shape vertical to the lengthwise direction of the Cu wiring 2 is provided in the polyimide film, so as to obtain a casting film 4 (see FIG. 2(*a*)). On the surface of the casting film 4 is provided a titan film 1*a* (see FIG. 2(*b*)) serving as a first barrier metal film later. A photo mask 7 is formed on a portion provided except for the groove surface of the casting film 4 of the titan film 1*a* and the Cu wiring 2 is formed (see FIG. 2(*c*)) within the groove of the casting film 4. As a method of forming the Cu wiring 2 is used a plating method. As the plating method can be used an electroplating method or an electroless plating method. In FIGS. 2(*a*) to 2(*c*), the Cu wiring 2 is formed by using the electroplating method. As one example of the electroplating method is a method of using copper sulfate plating liquid. The Cu wiring 2 of 3.7 $\mu$m in thickness (distance from the surface of titan film 1*a* measured in parallel to the depth direction of the groove of the casting film 4 to the surface of the Cu wiring 2 is approximately equal) in terms of treating conditions where the treating temperature is 25° C., the current density is 0.6 A/dm$^2$ and the treating time is 35 minutes.

Figure 3A:
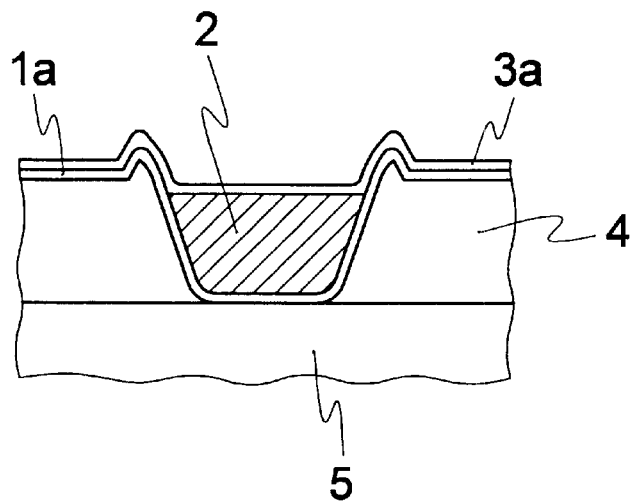
FIGS. 3(*a*) and 3(*b*) are sectional views for illustrating one embodiment of a method of producing of a semiconductor device of the invention.
Figure 3B:
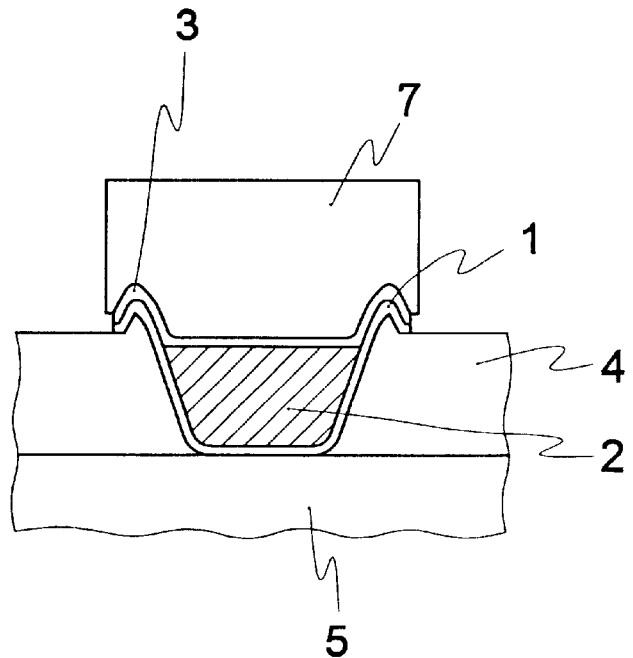

Titan (or titan nitride) film 3a serving as a second barrier metal film later is provided (see FIG. 3(a)) is provided on the surface of the titan film 1a and the Cu wiring 2. Finally, after the photo mask 7 has been formed on the groove of the casting film 4 and its surrounding portion of the titan (or titan nitride) film 3a, the unnecessary portion of the titan film 1a and the titan (or titan nitride) film 3a are removed, further the photo-mask is removed, so as to obtain the first barrier metal film 1 and the second barrier metal film 3 (see FIG. 3(b)).

The groove of the reversibly trapezoidal shape in section to be formed in the polyimide film can be easily obtained by the photo-lithography art of the polyimide resin and the thermal hardening treatment after the developing. In order to form the groove, the shrinkage of the polyimide film surface by thermal hardening caused mainly at the heating time is used.

In this embodiment, the casting film 4 is formed by using polyimide film, and can be formed by using, for example, epoxy resin film. An inorganic material such as silicon oxide and silicon nitride can be used. When the inorganic material is used, an isotropic etching operation has only to be conducted in forming the groove by using the photo-lithography art.

In a producing method described by using FIG. 2(a) to 2(c) and FIGS. 3(a) and 3(b), the Cu wiring 2 is formed by the electrolytic plating method. The Cu wiring 2 can be formed by using the electroless plating method, instead of the electroplating method. FIGS. 4(a) to 4(c) and FIGS. 5(a) to 5(c) are sectional illustrating views each showing the modified example in one embodiment of the method of producing the semiconductor device of this invention. Referring to FIGS. 4(a) to 4(c) and FIGS. 5(a) to 5(c), the same reference numerals are used in the same portions as those of FIGS. 2(a) to 2(c) and FIGS. 3(a) and 3(b).

Figure 4A:
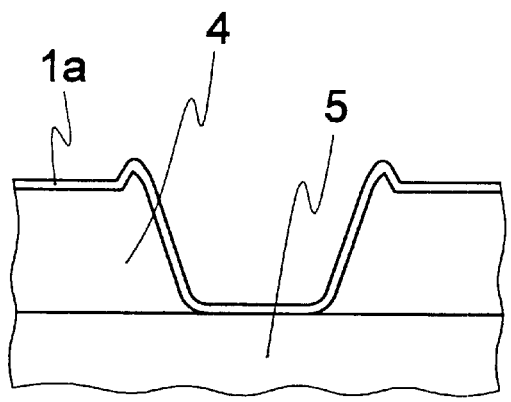
FIGS. 4(*a*) and 4(*c*) are sectional views for illustrating a modified example in one embodiment of a method of producing of a semiconductor device of the invention.
Figure 4B:
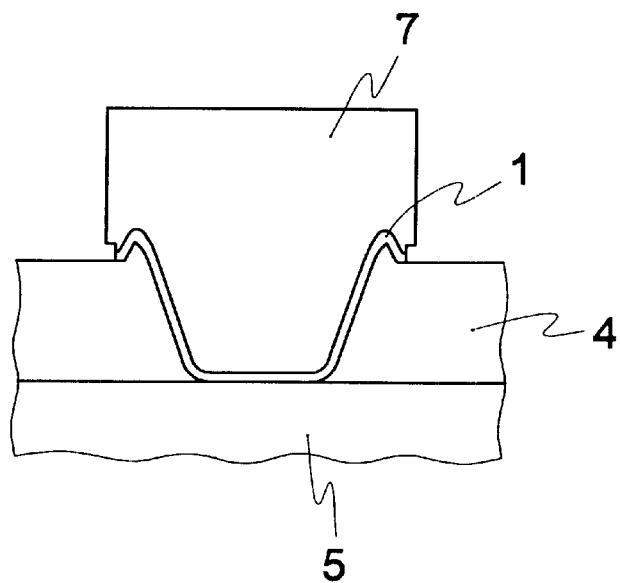
Figure 4C:
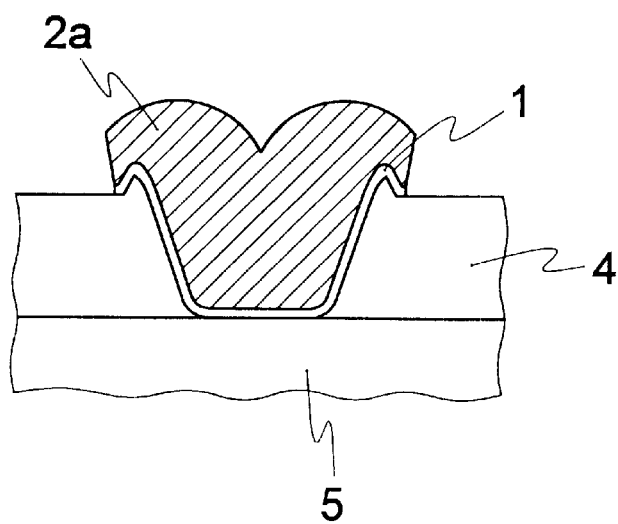

To the step of providing the titanium film 1a serving as the first barrier metal film later, on the surface of the casting film 4 is the same as that of the above producing method (see FIG. 4(a)). After the photo mask 7 has been formed on the groove and its surrounding portion of the casting film 4 by using the photo-lithography art, the unnecessary portion of the titan film 1a is removed, further the photo-mask is removed, so as to obtain the first barrier metal film 1 (see FIG. 4(b)). The Cu film 2a serving as Cu wiring later is formed by the electroless plating method on the surface of the first barrier metal film 1 (see FIG. 4(c). As one example of the electroless plating method is used plating liquid by using EDTA as chelate agent. The Cu film 2a of 2 μm in thickness is obtained under treatment condition of 50° C. for 30 minutes.

Figure 5A:
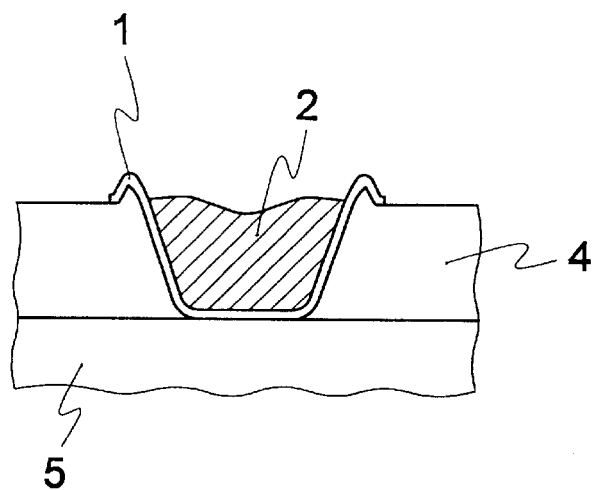
FIGS. 5(*a*) to 5(*c*) are sectional views for illustrating a modified example in one embodiment of a method of producing of a semiconductor device of the invention.
Figure 5B:
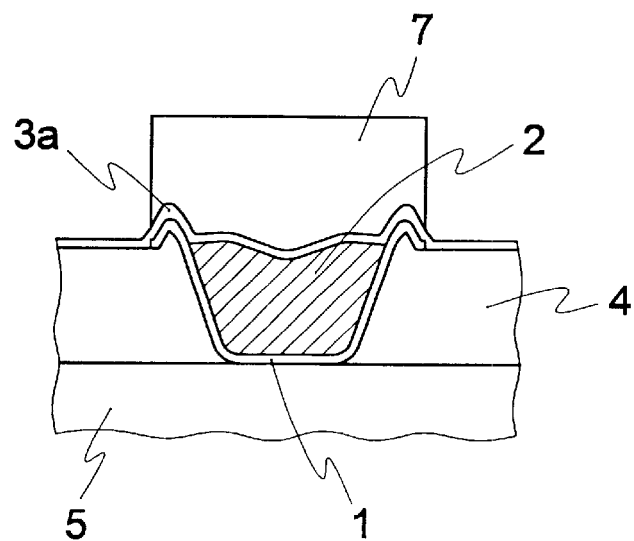
Figure 5C:
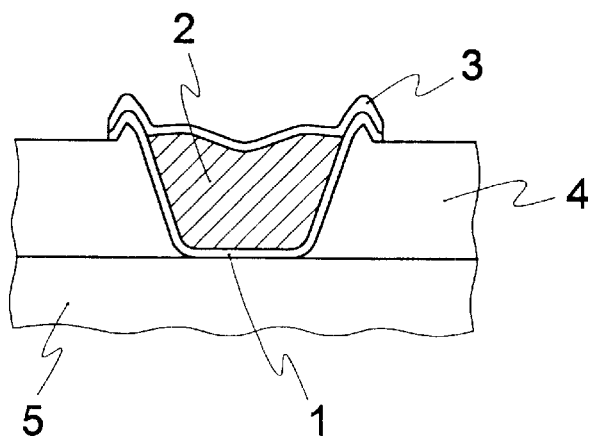

An excessively formed portion of the Cu film 2a is subjected to etch back, so as to obtain the Cu wiring 2 (see FIG. 5(a)). Titan (or titan nitride) film 3a serving as a second barrier metal film later is formed, on the first barrier metal film 1 and on the surface of the Cu wiring 2. A photo mask 7 is formed (see FIG. 5(b)) on the groove and its surrounding portion of the casting film 4, of the titan (or titan nitride) film 3a. Finally, the unnecessary portion of the titan (or titan nitride) film 3a is removed and the photo-mask 7 is removed, so as to obtain the second barrier metal film 3.

According to this embodiment, the Cu wiring where the shape of the section vertical to the lengthwise direction of the Cu wiring is reversibly trapezoidal can be obtained, so that the step coverage of the barrier metal film with respect to the Cu wiring can be improved.

In this embodiment, a polyimide resin can be used as a material of the casting film 4, but the embodiment is not restricted to it. The same effect can be obtained even in a case where the material of the insulating interlayer film to be included in the semiconductor element or the other material of the protective film for covering the semiconductor element surface is used. As the material of the insulating interlayer material to be included in the semiconductor element is silicon oxide, silicon nitride or epoxy resin. The polyimide film is especially preferable in that the stress can be relaxed, the value of the desired dielectric constant is provided, and the shielding effect of the alpha ray can be obtained. As the other material of the protective film of covering the semiconductor element surface is a silicon oxide, silicon nitride or epoxy resin. The silicon nitride of these materials is especially preferable, because a groove reversibly trapezoidal in section by an isotropic etching operation through a wet etching operation easily by applying the titan nitride film as a cover metal on the Al pattern such as Al electrode.

The example of one embodiment in the method of producing the semiconductor device of this invention will be described with reference to the drawings.

Figure 6:
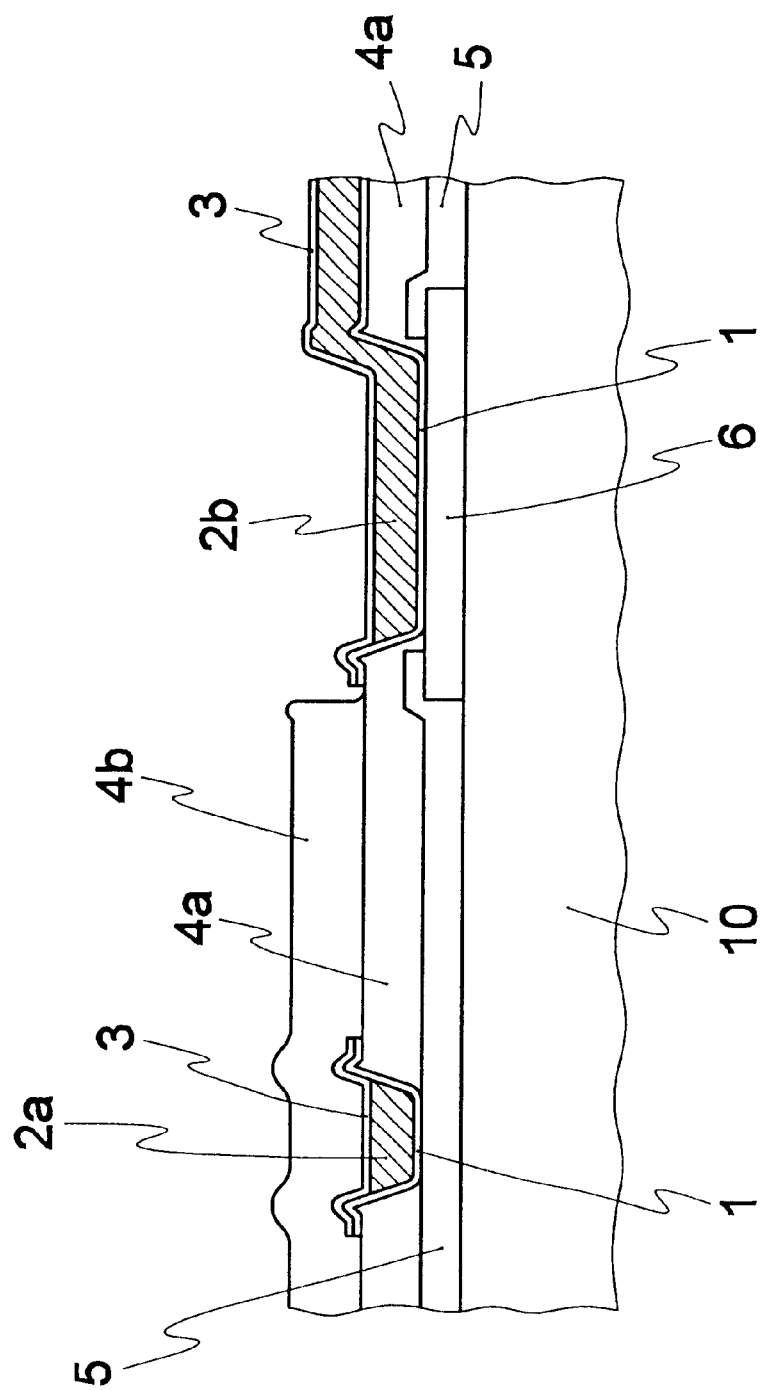
FIG. 6 is a sectional view for illustrating an application example in one embodiment of a method of producing of a semiconductor device of the invention.

FIG. 6 is a sectional illustrating view showing the application example of one embodiment of the method of producing the semiconductor device of this invention.

Referring to FIG. 6, the same reference numerals are used in the same portions as those of FIG. 1. Reference numeral 6 is an Al electrode serving as an outputting electrode, reference numeral 10 is a silicon substrate. The interlayer film 5, the Al electrode 6 and the silicon substrate 10 in FIG. 6 include one portion of the semiconductor element.

FIG. 6 shows a first Cu wiring 2a and a second Cu wiring 2b formed across two interlayers. In the present example, a first Cu wiring 2a is formed by using a method shown in FIG. 1 through FIGS. 5(a) to 5(c) after forming the first Cu wiring groove in the first casting film 4a using the first Cu wiring 2a and the second Cu wiring 2b.

Similarly a second casting film 4b is formed on the first casting film 4a by using a method shown in FIG. 1 through 5 to form the second Cu wiring 2b across the second casting film 4b from the first casting film 4a. The second barrier metal film 3 for the first Cu wiring 2a and the first barrier metal 1 for the second Cu wiring 2b are filmed at the same time.

Embodiment 2

The embodiment 2 of the semiconductor device and the method of producing the semiconductor device will be described with reference to the drawings.

Figure 7:
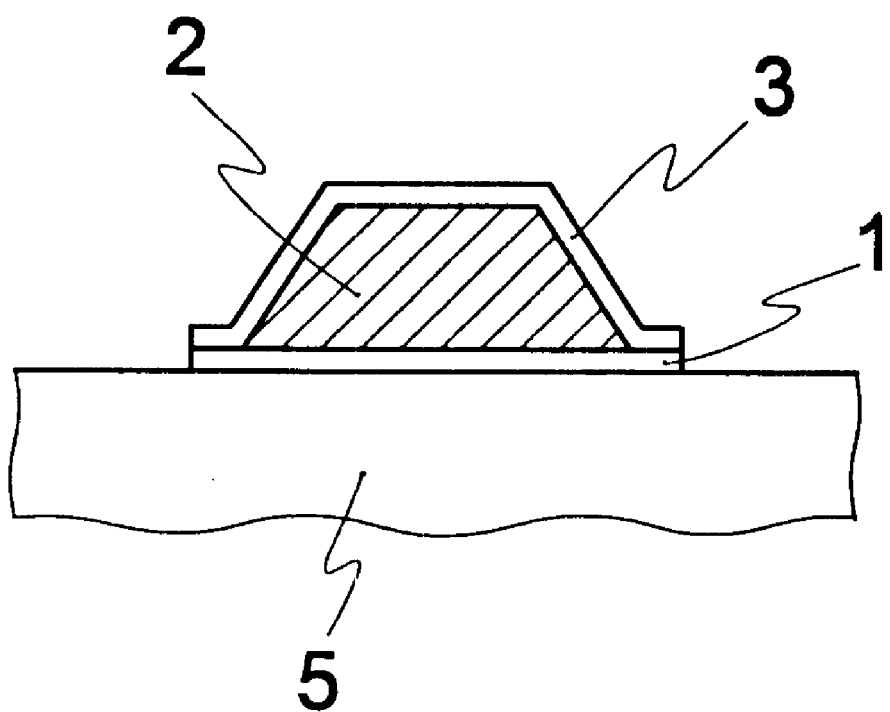
FIG. 7 is a sectional view for illustrating another embodiment of a semiconductor device of the invention.
Figure 8A:
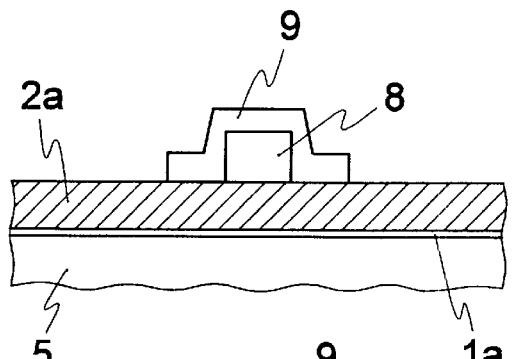
FIGS. 8(*a*) to 8(*e*) are sectional views for illustrating one embodiment of a method of producing a semiconductor device of the invention.
Figure 8B:
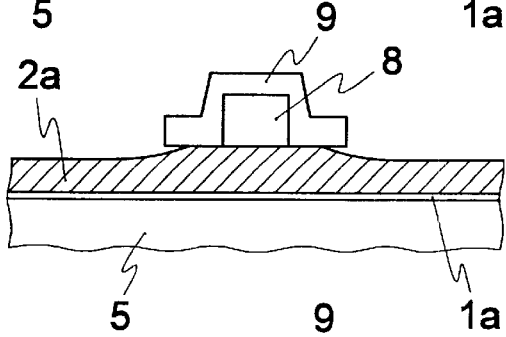
Figure 8C:
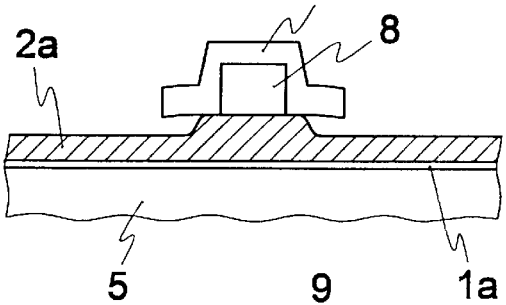
Figure 8D:
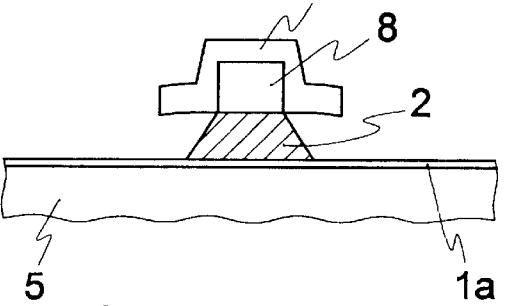
Figure 8E:
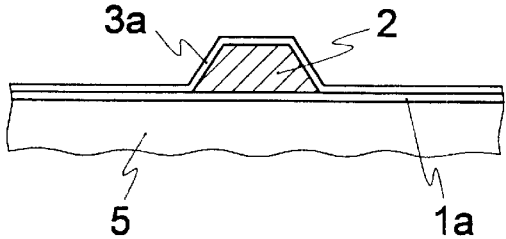
Figure 9:
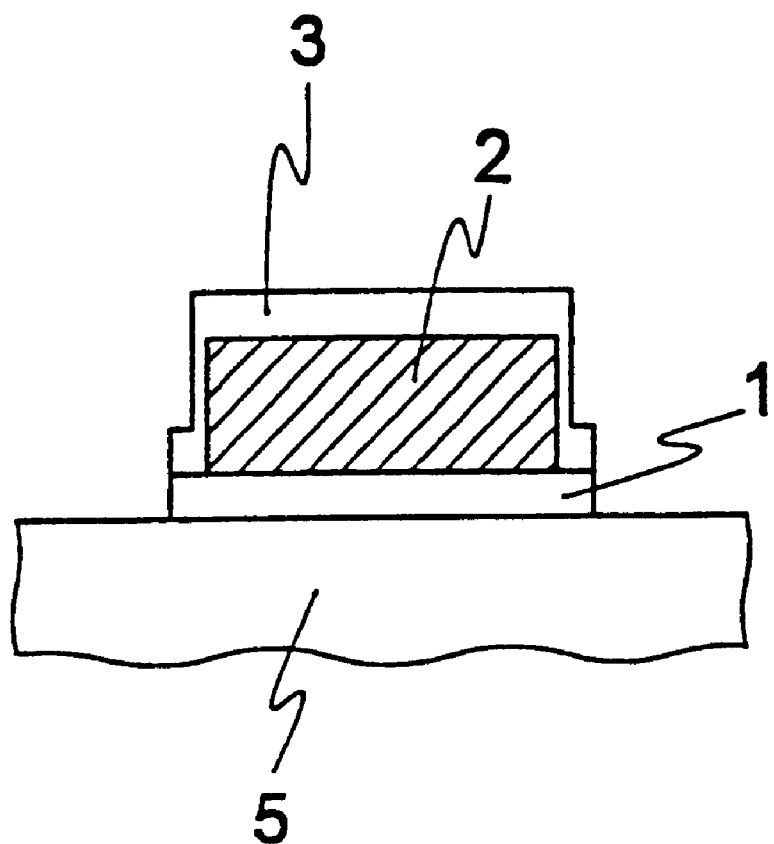
FIG. 9 is a sectional view for illustrating Cu wiring included in the conventional semiconductor device.

FIG. 7 is a sectional view showing other embodiment of the semiconductor device of this invention. FIG. 7 shows only the Cu wiring and its surrounding portion of the semiconductor device, and a section vertical to the lengthwise direction of the Cu wiring. In FIG. 7, the same reference numerals are used in the same portions as those of FIG. 1. In the present embodiment, Cu wiring which is reversibly trapezoidal in the sectional shape vertical to the lengthwise direction of the Cu wiring is formed by using two types of photo-masks in the etching operation for forming the Cu wiring 2. The first barrier metal film 1 covers the bottom face of the Cu wiring and the second barrier metal film 3 covers the top face of the side face of the Cu wiring. Polyimide resin is used as a material of the casting film 4.

Then, Embodiment 2 of the method of producing the semiconductor device of this invention will be described. FIGS. 8(a) to 8(e) are sectional views showing one embodiment of the method of producing the semiconductor device of this invention. In FIGS. 8(a) to 8(e), the same reference numerals are used in the same potions as those of FIG. 7.

On the surface of the interlayer film 5 are formed a titanium film 1a serving as a first barrier metal film later and a Cu film 2a, a metal film, serving as Cu wiring later. A first etching mask 8 is provided in a region serving as Cu wiring of the Cu wiring 2a, and a second etching mask 9 is provided (see FIG. 8(a)) in the region serving as the surrounding portion of the Cu wiring of the Cu film 2a. The adhesion force between the second etching mask 9 and the Cu film 2a is weaker than the adhesion force between the first etching mask 8 and the Cu film 2a. In the present embodiment, the material of the first etching mask 8 is different from the material of the second etching mask 9.

Then, the Cu film 2a is etched. As the adhesion force between the second etching mask 9 and the Cu film 2a is weak, a portion where the surface is covered by the second etching mask 9, of the Cu film 2a is gradually etched, so as to obtain the predetermined shape of Cu wiring 2 (FIG. 8(b), FIG. 8(c), and FIG. 8(d)). After the removing the first etching mask and the second etching mask, a titan film 1a and a titan (or titan nitride) film 3a serving as the second barrier metal film later are formed (see FIG. 8(e)) on the surface of the Cu wiring 2. Finally, the unnecessary portion of the titan film 1a and the titan (or titan nitride) film 3a are removed by the photo-lithography art, so as to obtain the first barrier metal film 1 and the second barrier metal film 3.

In the producing method described by using FIG. 8, the material of the first etching mask is made of material different from that of the second etching mask to form two types of photo-masks. By making the conditions different partially in the forming the etching mask by using the same material, two types of photo-masks can be formed.

As the modified example 1 of Embodiment 2 of the method of producing the semiconductor device of this invention is illustrated a case for forming two types of photo-masks by using the chemical treatment. In the modified example, one etching mask is formed of the same material and the etching mask of a portion in contact with the Cu film of a region serving as the surrounding portion of the Cu wiring is removed from the Cu film in forming the first etching mask and the second etching mask. Namely, a portion, removed from the Cu film, of one etching mask achieves the same function as that of the second etching mask, and the other portion achieves the same function as that of the first etching mask. A chemical treatment operation is used to peel the one portion of the etching mask from the Cu film. For example, as one example of the chemical treatment where the material of the etching mask is cyclization rubber negative resist is treatment for removing one portion of the etching mask from the Cu film with alkali solution.

As the modified example of Embodiment 2 of the method of producing semiconductor device of this invention will be described a case where two types of photo-masks are formed by changing the optical irradiation in providing the etching mask. In this modified example, the optical irradiation different respectively is applied upon the resist formed in a region serving as the Cu wiring of the Cu film surface, and the resist formed in a region serving as the surrounding portion of the Cu wiring of the Cu film surface, of the resists.

For example, time for optical irradiation with respect to the resist in contact with the region serving as the Cu wiring of the Cu film surface is made longer sufficiently, and the time for optical irradiation with respect to the resist in contact with a region which becomes the surrounding portion of the Cu wiring of the Cu film surface is made shorter. As a result, a first etching mask is provided in a region serving as the Cu wiring of the Cu film surface, and a second etching mask is provided in a region serving as a surrounding portion of the Cu wiring of the Cu film surface. In order to change the characteristics by a region within the same resist, optical irradiation can be applied upon a particular region of the resist. For example, a photo-mask which is made of the same material and achieves an either function of two types of photo-masks in the region by irradiation of Deep UV (ultraviolet rays of 220 through 300 nm in wave-length) or infrared rays with respect to resists in contact with the region serving as the Cu wiring of the Cu film surface.

In order to change the optical irradiation conditions, the time for optical irradiation and the optical wave-length can be changed, and further two types of materials and/or chemical treatment can be used.

According to this embodiment, the Cu wiring which is trapezoidal in section vertical to the lengthwise direction of the Cu wiring by the etching operation of the Cu film using two types of etching masks different mutually in the adhesion force with respect to the Cu film can be obtained. The step coverage of the barrier metal film with respect to the Cu wiring can be improved.

In the above described Embodiments 1 and 2, titan (titan nitride) is used as a material of the first barrier metal film and the second barrier metal film. The material is not limited to titan. The same effect can be obtained even in a case where tungsten or chrome is used.

A semiconductor device described in claim 1 according to this invention comprises a semiconductor element provided on a substrate, a lead-in wiring electrically connected with the electrode of the semiconductor element, a barrier metal film for covering the lead-in wiring surface for protecting the lead-in wire. The section of the lead-in wiring is inversely trapezoidal in shape which is vertical with respect to the length direction of the lead-in wiring, so as to improve the step coverage of the barrier metal film with respect to the lead-in wiring.

Furthermore, a semiconductor device according to claim 2 comprises a first barrier metal film for covering the bottom face and the side face of the lead-in wiring and a second barrier metal film for covering the top face of the lead-in wiring, so as to prevent the oxidation and corrosion of the lead-in wiring during the processing operation.

In a semiconductor according to claim 3, a material of the first barrier metal film and a second barrier metal film is one of titan, titan nitride, tungsten and chrome, so as to obtain superior adherence, resistance against the surface oxidation, and prevention (function as the barrier metal) of diffusion into the Al electrode of the Cu atom.

A method of producing a semiconductor device according to claim 4 of this invention comprises a first process of providing a semiconductor element on a substrate, and a second process of providing on the substrate the lead-in wiring electrically connected with the electrode of the semiconductor element and having the surface covered with the first barrier metal film and the second barrier metal film. The second process is composed of a material of the insulation interlayer film included in the semiconductor element or a protective material for covering the surfaces of the semiconductor element, comprising a process of forming a casting film having the reversibly trapezoidal groove, a process of providing a first barrier metal film on the surface of the casting film, a process of providing the lead-in wiring within the groove of the casting film through the first barrier metal film, and a process of providing the second barrier film on the top face of the lead-in wiring. The section of the lead-in wiring is inversely trapezoidal in shape which is vertical with respect to the length direction of the lead-in wiring, so as to improve the step coverage of the barrier metal film with respect to the lead-in wiring.

In a method of producing a semiconductor device according to claim 5, a material of the insulating interlayer film included in the semiconductor element is one of silicon oxide, silicon nitride, polyimide resin and epoxide resin. The wiring can be formed for general use by directly embedding the wiring into the semiconductor element (in a case of silicon oxide and silicon nitride), and forming a casting film made of polyimide resin or epoxy resin on the semiconductor element.

In a method of producing a semiconductor device according to claim 6, a material of the insulating interlayer film included in the semiconductor element is polyimide resin, so that the stress can be relaxed, and the thickness of the Cu wiring (or casting film) by the small restriction caused by the requirement of the shielding of the ( ray.

In a method of producing a semiconductor device according to claim 7, a material of the protective film for covering the surface of the semiconductor element is one of polyimide resin, silicon oxide, silicon nitride, and epoxide resin, so as to easily obtain an insulating film (insulation interlayer film) as a superior coverage film.

In a method of producing a semiconductor device according to claim 8, a material of the protective film for covering the surface of the semiconductor element is silicon nitride, so as to obtain the reversibly trapezoidal groove in section easily by an isotropic etching operation through wet etching with application of the titan nitride film as a cover metal on the Al pattern such as Al electrode or the like.

A method of producing a semiconductor device according to claim 9 of this invention comprises a first process of providing a semiconductor element on a substrate, and a second process of providing on the substrate the lead-in wiring electrically connected with the electrode of the semiconductor element and having the surface covered with the first barrier metal film and the second barrier metal film. The second process comprises a process of providing a first barrier metal film on the substrate, a process of a metal film whose one portion composes the lead-in wiring later on the first barrier metal film, a process of providing a first etching mask in a region which becomes lead-in wiring of the metal film, and providing a second etching mask where the adherence force with respect to the metal film is weaker than that between the first etching mask and the metal film in a region which becomes the surrounding portion of the lead-in wiring of the metal film, a process of forming the lead-in wiring, etching the metal film, a process of removing the first etching mask and the second etching mask, and a process of forming a second barrier metal film on the surface where the lead-in wiring is exposed. The section of the lead-in is reversibly trapezoidal in shape which is vertical with respect to the length direction of the lead-in wiring, so as to improve the step coverage of the barrier metal film with respect to the lead-in wiring.

In a method of producing a semiconductor device according to claim 10, the material of the first etching mask is different from the material of the second etching mask, so as to easily make the adherence force between the first etching mask and the metal film strong stronger than the adherence force between the second etching mask and the metal film.

A method of producing a semiconductor device according to claim 11 uses a chemical treatment to weaken the adherence force between the second etching mass and the metal film weaker than that between the first etching mass and the metal film, so as to form the first etching mask and the second etching mask with one material.

A method of producing a semiconductor device according to claim 12 is chemical treatment for peeling off at least one portion of the second etching mask from the metal film, so as to easily make the adherence force between the second etching mask and the metal film weaker than the adherence between the first etching mask and the metal film.

In a method of producing a semiconductor device according to claim 13, optical radiation in providing the first etching mask is different from that in providing the second etching mask, so as to form the first etching mask and the second etching mask with one material.

It should be understood that the apparatus and methods which have been shown and described herein are illustrative of the invention and are not intended to be limitative thereof. Clearly, those skilled in the art may conceive of variations or modifications to the invention. However, any such variations or modifications which falls within the purview of this description are intended to be included therein as well. Those scope of the invention is limited only by the claims appended hereto.

What is claimed is:

1. A semiconductor device comprising:
   a semiconductor substrate having a surface;
   a semiconductor element electrode located on the semiconductor substrate;
   an interlayer film on the surface of the semiconductor substrate;
   an insulating film on the interlayer film and including a groove with inner surfaces and a bottom surface, wherein the groove has, in a section perpendicular to a longitudinal direction of the groove, a reverse trapezoidal shape, and the bottom surface extends generally parallel to the surface of the semiconductor substrate;
   a first barrier metal film covering the inner surfaces and bottom surface of the groove;
   a lead-in wiring disposed in the groove on the first barrier metal film, extending, in the groove, generally parallel to and across a portion of the surface of the semiconductor substrate, and electrically connected to the electrode of the semiconductor element, wherein the lead-in wiring is copper; and
   a second barrier metal film covering a surface of the lead-in wiring and contacting the first barrier metal film so that each of the surfaces of the lead-in wiring is covered by one or the other of the first and second barrier metal films, wherein the first and second barrier metal films are selected from the group consisting of titanium and titanium nitride.

2. The semiconductor device of claim 1 wherein the insulating film is an organic material.

3. The semiconductor device of claim 1 wherein the insulating film is an inorganic material.

4. A semiconductor device comprising:
   a semiconductor substrate having a surface;
   a semiconductor element electrode located on the semiconductor substrate;

an interlayer film on the surface of the semiconductor substrate;

an insulating film on the interlayer film and including a groove with inner surfaces and a bottom surface, wherein the groove has, in a section perpendicular to a longitudinal direction of the groove, a reverse trapezoidal shape, and the bottom surface extends generally parallel to the surface of the semiconductor substrate;

a first barrier metal film covering the inner surfaces and bottom surface of the groove;

a lead-in wiring disposed in the groove on the first barrier metal film, extending, in the groove, generally parallel to and across a portion of the surface of the semiconductor substrate, and electrically connected to the electrode of the semiconductor element; and a second barrier metal film covering the lead-in wiring and contacting the first barrier metal film so that each of the surfaces of the lead-in wiring is covered by one or the other of the first and second barrier metal films, wherein the first and second barrier metal films are selected from the group consisting of titanium and titanium nitride.

5. The semiconductor device of claim 4, wherein the lead-in wiring is a metal that may corrode.

6. The semiconductor device of claim 4 wherein the insulating film is an organic material.

7. The semiconductor device of claim 4 wherein the insulating film is an inorganic material.

8. A semiconductor device comprising:

a semiconductor substrate having a surface;

a semiconductor element electrode located on the semiconductor substrate;

an interlayer film on the surface of the semiconductor substrate;

a first insulating film on the interlayer film;

a second insulating film on the first insulating film and including a groove with inner surfaces and a bottom surface, wherein the groove has, in a section perpendicular to a longitudinal direction of the groove, a reverse trapezoidal shape, and the bottom surface is generally parallel to the surface of the semiconductor substrate;

a first barrier metal film covering the inner surfaces and bottom surface of the groove;

a lead-in wiring disposed in the groove on the first barrier metal film, extending across the interlayer film and the first insulating film generally parallel to the surface of the semiconductor substrate, and penetrating through the first insulating film, reaching and electrically connected to the electrode of the semiconductor element; and a second barrier metal film covering the lead-in wiring and contacting the first barrier metal film so that each of the surfaces of the lead-in wiring is covered by one or the other of the first and second barrier metal films, wherein the first and second barrier metal films are selected from the group consisting of titanium and titanium nitride.

9. The semiconductor device of claim 8 wherein the first and second insulating films are an organic material.

10. The semiconductor device of claim 9 wherein the first and second insulating films are polyimide.

11. The semiconductor device of claim 8 wherein the lead-in wiring is copper.

* * * * *